United States Patent
Du

(10) Patent No.: US 7,113,236 B2
(45) Date of Patent: Sep. 26, 2006

(54) LIQUID CRYSTAL DISPLAY HOUSING WITH LEDS FORMED BELOW THE LOWER SURFACE OF THE EXTENDING FPCB INSET INTO OPENINGS OF THE HOUSING

(75) Inventor: Chang-Lung Du, Taipei Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/709,525

(22) Filed: May 12, 2004

(65) Prior Publication Data
US 2005/0179850 A1    Aug. 18, 2005

(30) Foreign Application Priority Data
Feb. 12, 2004    (TW) ............................ 93103399 A

(51) Int. Cl.
*G02F 1/1333*    (2006.01)
*G02F 1/13357*    (2006.01)

(52) U.S. Cl. .................. 349/58; 349/150; 349/68; 349/61; 349/69

(58) Field of Classification Search ........ 349/149–152, 349/58, 38; 174/254; 361/749, 750
See application file for complete search history.

(56) References Cited

U.S. PATENT DOCUMENTS

2002/0027634 A1* 3/2002 Kang et al. ................. 349/150
2003/0164903 A1* 9/2003 Saito et al. .................. 349/58

* cited by examiner

Primary Examiner—Andrew Schechter
Assistant Examiner—Lucy Chien
(74) Attorney, Agent, or Firm—Winston Hsu

(57) ABSTRACT

A liquid crystal display (LCD) module is provided. The LCD module includes a housing that includes a plurality of openings formed in a lower surface of the housing, an LCD panel formed within the housing, a flexible printed circuit board (FPCB) formed on the edge of the peripheral circuit area of the LCD panel. The FPCB has a extending portion and a plurality of light emitting diodes (LEDs) formed below the lower surface of the extending portion. The LEDs of the FPCB inset into corresponding openings of the housing when the extending portion of the FPCB crosses the edge of the LCD panel and is deflexed to the lower surface of the housing.

11 Claims, 4 Drawing Sheets

LIQUID CRYSTAL DISPLAY HOUSING WITH LEDS FORMED BELOW THE LOWER SURFACE OF THE EXTENDING FPCB INSET INTO OPENINGS OF THE HOUSING

BACKGROUND OF INVENTION

1. Field of the Invention

The present invention relates to a liquid crystal display (LCD) module, and more particularly, to a modified LCD module using a plurality of light emitting diodes (LEDs) as a backlight source.

2. Description of the Prior Art

Liquid crystal display (LCD) devices have been widely used in notebooks, personal digital assistants(PDAs), cellular phones, and other electronic products because the price of LCDs is low and the quality of LCDs is high. LCDs are passive optical devices. Therefore, a frontlight module or a backlight module needs to be attached to the LCD panel to provide sufficient illumination to make the LCD device visible at night and display in full color. Generally, the backlight module, comprising a light source generation and a diffusion sheet, is usually attached below the LCD panel to provide the light source and to disperse the light uniformly. The dispersed light is imported to the LCD panel to display an image.

Currently, the light source generator of the backlight module usually is one of two types. One type is a cold cathode fluorescence lamp (CCFL) and the other type is a light emitting diode (LED). The luminescent efficiency of the CCFL is relatively higher, but the volume of the CCFL is bigger and the CCFL consumes more electricity. Therefore, the CCFL is only suitable for a multicolored display having great brightness levels and a big size. The luminescent efficiency of the LED is lower, the volume of the LED is smaller, the emitter light of the LED is more focused, and the life of the LED is longer. In addition, even when the LED is abandoned, the LED results in less pollution. Therefore, the LED is suitable for a monochromatic, electrically-efficient small sized product, such as an LCD panel used in a cellular phone or used in a vehicles satellite navigation system.

Please refer to FIG. 1, which is a structural schematic diagram of an LCD module 10 according to the prior art. As shown in FIG. 1, the LCD module 10 comprises an LCD panel 12 used for displaying an image, a backlight module 14 used for providing a light source, a printed circuit board (PCB) 16, a flexible printed circuit board (FPCB) 18 used to electrically connect the LCD panel 12 with the PCB 16, and a FPCB 20 used to electrically connect the backlight module 14 with the PCB 16.

Generally, the backlight module 14 comprises a plurality of LEDs arranged in an array and formed on a substrate. A reflecting plate, a light-guide plate, a diffusion sheet, and an optical prism are installed on the substrate of the backlight module 14 (not shown). The light-guide plate keeps the light produced by the LEDs illuminating the LCD panel 12 more uniformly. The reflecting plate mostly adheres to the lower surface of the light-guide plate for reflecting the light produced by the LEDs upward to increase the light utilization rate. The reflecting plate could be a smooth white cardboard. The diffusion sheet diffuses the incident light source to provide a more uniform light source to the LCD panel. The optical prism increases the light intensity. Additionally, the quantities and the arrangement of the reflecting plate, the light-guide plate, the diffusion sheet, and the optical prism could be modified according to design requirements.

It is noted that the PCB 16 further comprises a plurality of electrical components (not shown). The LCD panel 12 further comprises at least one source driver integrated circuit 22 and at least one drain driver integrated circuit 24. The FPCB 18 electrically connects the electrical components of the PCB 16 with the source driver integrated circuit 22 and the driver integrated circuit 24 of the LCD panel 12. The FPCB 18 also electrically connects with the LEDs of the backlight module 14. Therefore, the LCD module 10 of the prior art can control the electrical components of the PCB 16 to make the LEDs illuminate, and to drive the source driver integrated circuit 22 and the driver integrated circuit 24 of the LCD panel 12 to illuminate the LCD panel 12 to display an image.

Furthermore, the LCD module 10 also can mount the FPCB 20, electrically connecting with the backlight module 14, by a way that is to adhere or to solder or to electrically connect with the FPCB 18. Additionally, the FPCB 18 electrically connects with the PCB 16.

However, the aforementioned LCD modules 10 of the prior art need the FPCB 18 and the FPCB 20 to respectively electrically connect the LCD panel 12, the backlight module 14, and the PCB 16 to respectively drive the LCD panel 12 and the backlight module 14. However, the price of the FPCB is very expensive. Therefore, how to compete in the market, how to reduce the cost, and how to fabricate a product with a high quality are big problems in the current LCD module field.

SUMMARY OF INVENTION

It is therefore a primary objective of the present invention to provide a modified liquid crystal display (LCD) module to reduce the cost.

Another objective of the present invention is to provide a modified LCD module using light emitting dioides (LEDs), formed on the flexible printed circuit board (FPCB) to connect with the LCD panel, as a backlight source. Therefore, no extra processes or connectors for connecting the LEDs with the FPCB and the LCD panel are needed.

To achieve the abovementioned objects, the claimed invention provides an LCD module including a housing having a plurality of openings formed in a lower surface of the housing, and an LCD panel formed within the housing. The LCD panel includes a display area and a peripheral circuit area formed on the LCD panel. A plurality of driver integrated circuits are formed in the peripheral circuit area of the LCD panel and an FPCB is formed on the edge of the peripheral circuit of the LCD panel. The FPCB has an extending portion and a plurality of LEDs formed directly below the lower surface of the extending portion of the FPCB. The FPCB is deflexed to the lower surface of the housing to make the LEDs formed in the lower surface of the FPCB inset into respective openings of the housing.

Therefore, the LCD module of the present invention has the advantage of cost-saving and room-saving. Additionally, the LCD module of the present invention is light and thin. For this reason, the LCD module of the present invention is convenient to be used in any portable product.

DETAILED DESCRIPTION

Figure 1:
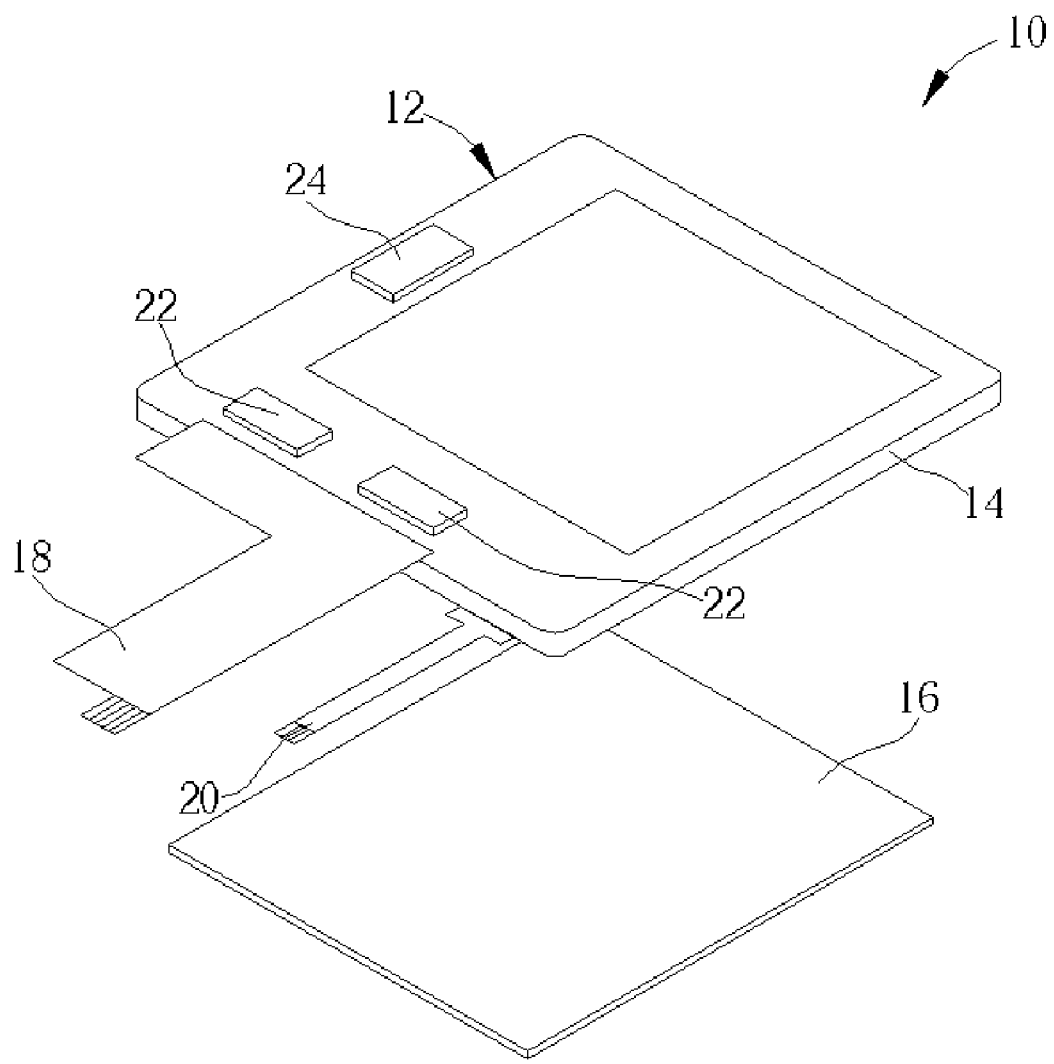
FIG. 1 is a structural schematic diagram of the LCD module according to the prior art.
Figure 2:
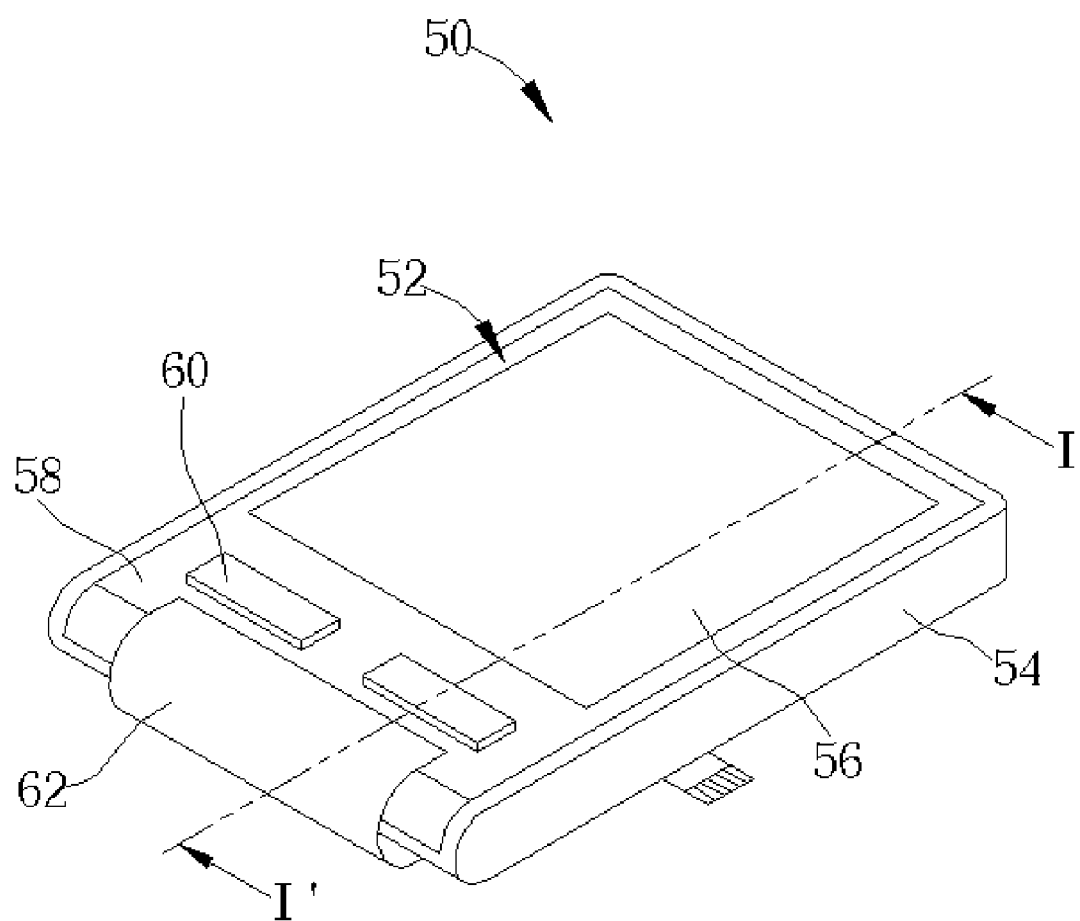
FIG. 2 is a structural schematic diagram of the LCD module according to the present invention.

Please refer to FIG. 2, which is a structural schematic diagram of an LCD module 50 according to the present invention. As shown in FIG. 2, the LCD module 50 of the present invention comprises a LCD panel 52 formed below the upper surface of the housing 54. The LCD panel 52 comprises a display area 56 and a peripheral circuit area 58 formed on the LCD panel 52, a plurality of driver integrated circuits 60 formed in the peripheral circuit area 58 of the LCD panel 52 to drive the LCD panel 52, and a FPCB 62 formed on the edge of the peripheral circuit area 58 of the LCD panel 52. The FPCB 62 comprises an extending portion deflexed to the lower surface of the housing. Each of the driver integrated circuits 60 could be a gate driver integrated circuit or a source driver integrated circuit. Each of the driver integrated circuits 60 could be adhered to the LCD panel 52 by using the technology of the chip on glass (COG).

Figure 3:
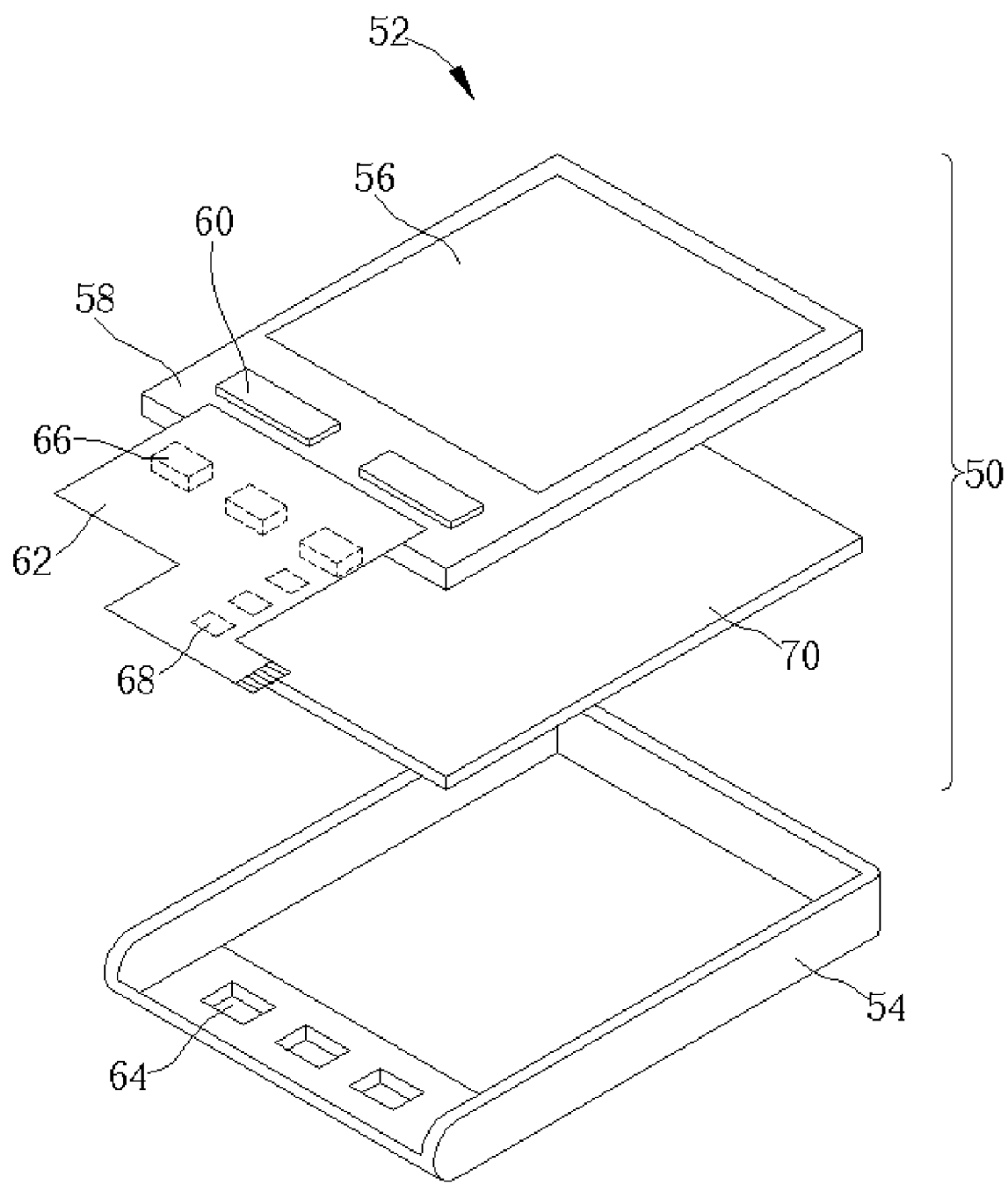
FIG. 3 is an exploded diagram of the LCD module shown in FIG. 2.

Please refer to FIG. 3, which is an exploded diagram of the LCD module 50 shown in FIG. 2. As shown in FIG. 3, the housing 54 of the present invention is almost rectangular plate-shaped reflect-frame. The housing 54 comprises a plurality of openings formed in a lower surface of the housing. A plurality of LEDs are formed below the lower surface of the extending portion of the FPCB 62. Generally, the FPCB 62 could be a copper clad laminate or a tape carrier package (TCP). Additionally, the FPCB 62 comprises a plurality of electrical components 68 formed below the lower surface of the FPCB 62 to control the operation of the LCD module 50 and the LEDs 66. The LCD module 50 of the present invention further comprises a light-guide plate 70, a upper diffusion sheet, an optical thin film, a lower diffusion sheet, or a reflecting plate (not shown) formed between the LCD panel 52 and the housing 54 to increase the light utilization rate and to provide a more uniform light source.

Figure 4:
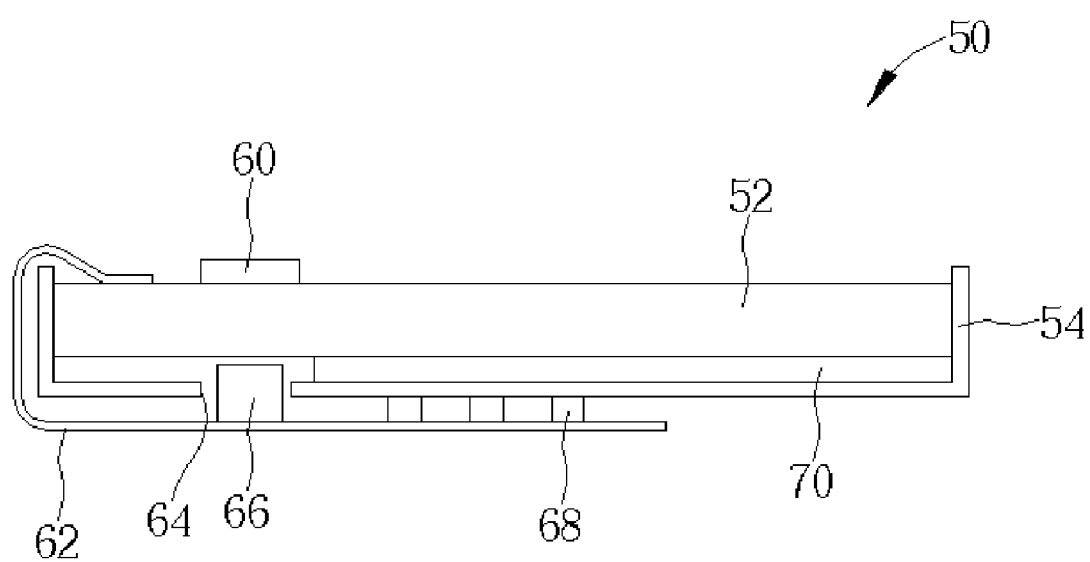
FIG. 4 is a profile schematic drawing of the LCD module cut along the line I–I' in FIG. 2

Please refer to FIG. 4, which is a profile schematic drawing of the LCD module 50 cut along the line I–I' of FIG. 2. As shown in FIG. 4, the LEDs 66 of the FPCB 62 would inset into corresponding openings 64 of the housing 54 when the extending portion of the FPCB 62 crosses the edge of the LCD panel 52 and is deflexed to the lower surface of the housing 54. Therefore, the LEDs 66 formed below the LCD module 50 are used as a backlight source.

The LEDs 66 of the FPCB 62 produce light when the electrical components 68 formed below the lower surface of the FPCB 62 function as a backlight of the LCD module 50. The light is delivered into the light-guide plate 70 because of the recess at the side of the light-guide plate 70 (not shown). The light is scattered in the light-guide plate 70, then the light is reflected by the housing 54. Next, the light is uniformly delivered to the LCD panel 52 by the diffusion sheet or the optical thin film to illuminate the LCD module 50. Finally, the electrical components 68 of the FPCB 62 drive the driver integrated circuits 60 formed in the peripheral circuit area 58 to display an image.

It is noted that the LCD module of the present is not limited to an LCD panel, as it can be further used in the other electronic products having an embedded backlight-type LCD device. Additionally, the LEDs of the LCD module of the present invention could be dispersedly arranged in the two sides of the lower surface of the FPCB to provide sufficient light. The arrangement of the LEDs could be symmetric or non-symmetric. The quantity and the arrangement of the reflecting plate, the light-guide plate, the diffusion sheet, and the optical prism can also be modified according to design requirements.

To sum up, the LEDs of the LCD module of the present invention are directly formed below the lower surface of the FPCB of the LCD panel to form an integrated structure, comprising the LEDs and the FPCB of the LCD panel, so as to save costs. The extending portion of the FPCB of the present invention LCD module is deflected to the lower surface of the housing to make the LEDs formed below the lower surface of the FPCB respectively inset into the openings of the housing to save room. Additionally, the housing could comprise a material with a high reflection coefficient. Therefore, the housing directly reflects the light produced by the LEDs to form a uniform light without any reflecting plate installed between the housing and the LCD panel to save costs. The FPCB is deflexed to the lower surface of the housing to make the LEDs formed below the lower surface of the FPCB respectively inset into the openings of the housing. Therefore, the LCD module of the present invention has the advantage of cost-saving and room-saving. Additionally, the LCD module of the present invention is light and thin. For this reason, the LCD module of the present invention is convenient to be used in any portable product.

In comparison with the conventional LCD module, the present invention LCD module just needs the FPCB electrically connected with the LCD panel and the LEDs to drive the LCD panel and the LEDs. Further, the present invention LCD module directly forms the LEDs, used as the backlight source of the LCD panel, below the lower surface of the FPCB without any extra processes or connectors for connecting the LEDs with the FPCB and the LCD panel. Therefore, LCD module of the present invention has the advantage of cost-saving, light, and thin so as to be suitable for the small-size portable products.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A liquid crystal display (LCD) module, comprising:
   a housing comprising a plurality of openings formed in a lower surface of said housing;
   an LCD panel formed within said housing, said LCD panel comprising a display area, a peripheral circuit area formed on said LCD panel, and a plurality of driver integrated circuits formed in the peripheral circuit area of the LCD panel; and
   a flexible printed circuit board (FPCB) formed on the edge of the peripheral circuit area of the LCD panel, the FPCB having an extending portion and a plurality of light emitting diodes (LEDs) formed below the lower surface of the extending portion;
   wherein the LEDs of the FPCB would be inset into corresponding openings of the housing when the extending portion of the FPCB crosses the edge of the LCD panel and being deflexed to the lower surface of the housing.

2. The LCD module of claim 1 wherein the housing is a rectangular-platy reflect-frame.

3. The LCD module of claim 1 wherein the LCD panel is a thin film transistor LCD (TFT-LCD) panel.

4. The LCD module of claim 1 wherein the FPC board comprises a copper clad laminate or tape carrier package.

5. The LCD module of claim 1 wherein each of the LEDs is a backlight source of the LCD panel used to illuminate the LCD panel.

6. The LCD module of claim 1 wherein each driver integrated circuit comprises a gate driver integrated circuit or source driver integrated circuit.

7. The LCD module of claim 1 further comprising a light-guide plate, a diffusion sheet, or an optical thin film formed between the LCD panel and the housing.

8. The LCD module of claim 1 further comprising a plurality of electrical components formed below the lower surface of the FPCB.

9. A liquid crystal display (LCD) module, comprising:
a housing comprising a plurality of openings formed in a lower surface of said housing;
an LCD panel comprising a display area and a peripheral circuit area; and
a flexible printed circuit hoard (FPCB) connected to the edge of the peripheral circuit area, the FPCB having an extending portion and a plurality of light emitting diodes (LEDs) connected to the lower surface of the extending portion;
wherein the extending portion of the FPCB crosses the edge of the housing and the LEDs inset into the corresponding openings of the housing.

10. The LCD module of claim 9 further comprising a plurality of driver integrated circuits formed in the peripheral circuit area of the LCD panel.

11. The LCD module of claim 9 wherein the flexible printed circuit board is connected to the edge of the peripheral circuit area by the lower surface of the extending portion.

* * * * *